United States Patent [19]

Kusunoki et al.

[11] Patent Number: 4,661,167

[45] Date of Patent: Apr. 28, 1987

[54] METHOD FOR MANUFACTURING A MONOCRYSTALLINE SEMICONDUCTOR DEVICE

[75] Inventors: Shigeru Kusunoki, Itami; Tadashi Nishimura, Kawanishi; Kazuyuki Sugahara, Itami, all of Japan

[73] Assignee: Mitsubishi Denki Kabushiki Kaisha, Tokyo, Japan

[21] Appl. No.: 677,343

[22] Filed: Dec. 3, 1984

[30] Foreign Application Priority Data

Jan. 17, 1984 [JP] Japan .................................. 59-6671

[51] Int. Cl.⁴ ......................................... H01L 21/263
[52] U.S. Cl. .................................. 148/1.5; 29/576 T; 148/DIG. 164; 156/617 R
[58] Field of Search ...... 148/1.5, DIG. 93, DIG. 164; 29/576 T; 427/86, 87; 156/657

[56] References Cited

U.S. PATENT DOCUMENTS

| | | | |
|---|---|---|---|
| 4,543,133 | 9/1985 | Mukai | 148/1.5 |
| 4,559,102 | 12/1985 | Hayafuji | 156/605 |
| 4,575,925 | 3/1986 | Kanbara et al. | 29/576 W |
| 4,584,025 | 4/1986 | Takaoka et al. | 148/1.5 |
| 4,592,799 | 6/1986 | Hayajuji | 156/617 R |

OTHER PUBLICATIONS

Mukai, R. et al, "Indirect Laser Annealing of Polysilicon for Three-Dimensional IC's", in *IEEE International Electron Devices Meeting*, Washington, D.C., Dec. 5-6-7, 1983, pp. 360-363.

Douglas, J. H., "The Route to 3-D Chips", in *High Technology*, Sep. 1983, pp. 55-59.

Akiyama, S. et al, "Multilayer CMOS Device Fabricated on Laser Recrystallized Silicon Islands", in *IEEE International Electron Devices Meeting*, Wash. D.C., 12/5-7/83, pp. 352-355.

J. P. Colinge et al, "Use of Selective Annealing for Growing Very Large Grain Silicon on Insulator Films", in Appl. Phys. Lett., 41(4), 15 Aug. 1982.

*Primary Examiner*—Brian E. Hearn
*Assistant Examiner*—Tuan Quach
*Attorney, Agent, or Firm*—Birch, Stewart, Kolasch & Birch

[57] ABSTRACT

A method for manufacturing a semiconductor device, which comprises: a first process for producing a semiconductor layer of polycrystalline silicon or amorphous silicon on the surface of a substrate of insulator or a substrate made up by forming an insulating layer on a basic semiconductor; a second process for producing an island of semiconductor layer surrounded by dielectric materials from the semiconductor layer; a third process for producing a film of $Si_3N_4$ on the island of semiconductor layer, or on a film of $SiO_2$ formed on the island; a fourth process for removing the film of $Si_3N_4$ at a predetermined region on the island; and a fifth process for irradiating with scanning an energy beam to the island of semiconductor layer so as to melt and recrystallize the island, thereby monocrystallizing or increasing the size of crystal grains at at least a partial region thereof.

11 Claims, 20 Drawing Figures (a)

(b)

(c)

(d)

(e)

(f)

(g)

(h)

(i)

(a)

(b)

(c)

(d)

(e)

(f)

(g)

F I G .3.
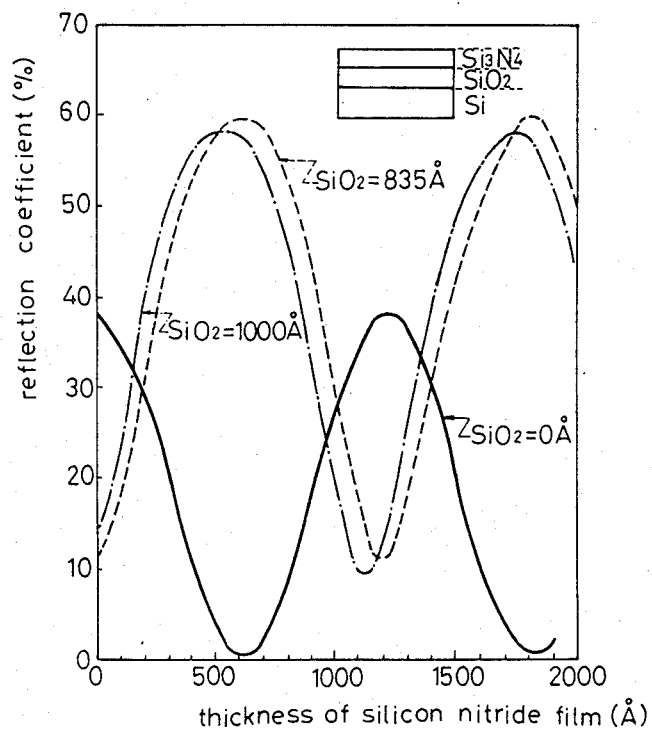

(a)

(b)

(c)

METHOD FOR MANUFACTURING A MONOCRYSTALLINE SEMICONDUCTOR DEVICE

FIELD OF THE INVENTION

The present invention relates to a method for manufacturing a semiconductor device, and more particularly to the improvement in a method for forming a semiconductor monocrystalline film on an insulator so as to constitute a substrate whereon a semiconductor device is produced.

BACKGROUND OF THE INVENTION

In order to increase operation speed and to provide a higher degree of integration in semiconductor devices, several attempts have been made to provide a method for manufacturing a semiconductor integrated circuit device wherein dielectric materials are used to separate circuit components so that they may have small stray capacitances.

According to one such method a polycrystalline or amorphous semiconductor film is deposited on an insulator, and the surface thereof is irradiated by an energy beam such as laser beam or electron beam thereof so as to heat only its surface layer, thereby producing a monocrystalline semiconductor film. Thereafter, a MOS field effect transistor (hereinafter referred to as "MOSFET") is produced on the semiconductor film. Thus, an element which has a small stray capacitance is realized with its periphery and its bottom being isolated by a dielectric material.

The main steps of the production process of such a prior art MOSFET are illustrated in FIGS. 1(a) to (i). The manufacturing process is described below:

As shown in FIG. 1(a), a poly-silicon layer 11 of thickness 5,000 Å is deposited on a quartz (SiO$_2$) substrate 10 by a usual low pressure chemical vapour deposition (hereinafter referred to as "LPCVD"). The product is exposed to the ozidizing atmosphere of 950° C. to form an oxide film (SiO$_2$) 12 of thickness 500 Å, and a nitride film (Si$_3$N$_4$) 13 of thickness 1,000 Å is deposited thereon by a LPCVD method as shown in FIG. 1(b). Thereafter, as shown in FIG. 1(c), the nitride film 13 is patterned through a photolithography process. Subsequently, the product is exposed to the oxidizing atmosphere of 950° C. for a long time so as to oxidize the portions where the nitride film 13 does not exist, and thereafter the nitride film 13 and the oxide film 12 under the film 13 are removed to obtain an island of poly-silicon layer 11 with its periphery and its bottom surrounded by the SiO$_2$ film 14 as an insulator. However, the poly-silicon layer 11 does not have a crystalline structure capable of producing elements. So, an energy beam such as a laser beam or electron beam is irradiated to the poly-silicon layer 11 so as to melt and recrystallize the same to form a monocrystalline silicon layer, or a polycrystalline silicon layer comprising large crystal particles. This step is shown in FIG. 1(e), wherein the reference numeral 15 designates a recrystallized silicon layer.

Thereafter, the recrystallized silicon layer 15 is used as a substrate to form a MOSFET. The manufacturing process thereof is the same as that of the usual MOSFET. That is, a gate oxide film 16 is formed on the recrystallized silicon layer 15 as shown in FIG. 1(f). Polycrystalline silicon is deposited thereon as shown in FIG. 1(g), and the poly-silicon is patterned to form a poly-silicon gate electrode 17. Subsequently, as shown in FIG. 1(h), the poly-silicon gate electrode 17 is used as a mask for introducing a large number of impurities into the recrystallized silicon layer 15, thereby producing a source region 18 and a drain region 19 in the silicon layer 15. Thereafter, as shown in FIG. 1(i), an oxide film 20 is formed thereon, and the portions of the oxide film 20 above the gate electrode 17, the source region 18, and the drain region 19 are opened to form contact holes. A gate wiring 21, a source wiring 22, and a drain wiring 23 of aluminum are formed on respective regions embedding the contact holes, and a surface protection film 24 is formed thereon to complete a MOSFET.

In this process the semiconductor layer is isolated to form island patterns, but there is no seed to determine the direction of crystallization in the recrystallizing process. The crystal nucleation occurs at random both timewise and positionally, depending on the temperature distribution that is determined by the power distribution of the laser or electron beam and the material, and it is only possible to control the direction of generation of crystal grains (refer to Japanese Laid Open Patent Publication No. Sho. 58-192381). A pattern configuration capable of generating large crystal grains may exist occasionally, but it is impossible to monocrystallize any island of semiconductor layer.

Another prior art method for manufacturing a semiconductor device is reported in an article "Use of selective annealing for growing very large grain silicon on insulator", Appl. Phys. Lett. 41 pp 346 (1982), by J. P. Colinge et al. According to this method a strip type antireflection film made of silicon nitride is produced by depositing a poly-silicon layer on the entire surface of a silicon wafer, and irradiated by a laser by scanning along the strip so as to monocrystallize the entire surface thereof.

OBJECTS AND SUMMARY OF THE INVENTION

The present invention is directed to solve the problems pointed out above, and has for its object to provide a method for manufacturing a semiconductor device capable of obtaining a monocrystalline semiconductor layer with good reproducibility, and further capable of producing a reliable semiconductor device thereon.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

According to one aspect of the present invention, there is produced an insulating layer as an antireflection film comprising a silicon nitride film, or a silicon nitride film and a silicon oxide film at the periphery of an island semiconductor layer, and it is irradiated by an energy beam such as an argon laser of high power and continuous oscillation with scanning so as to melt and recrystallize the island semiconductor layer, thereby producing a temperature distribution suitable for monocrystallization inside the semiconductor layer.

BRIEF DESCRIPTION OF THE DRAWINGS

FIG. 3 is a diagram showing the characteristics of the reflectivity of the argon laser against silicon nitride film thickness while producing a silicon nitride film on a silicon substrate.

DETAILED DESCRIPTION OF THE PREFERRED EMBODIMENTS

Figure 1:
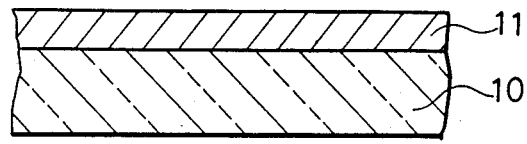
FIGS. 1(a) to (i) are diagrams showing the main steps for manufacturing a prior art MOSFET.
Figure 1:
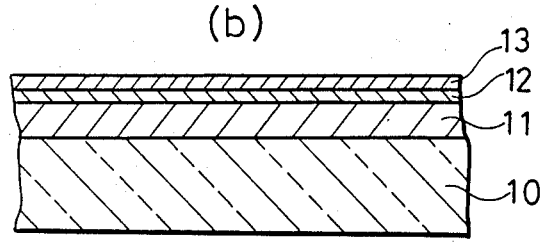
Figure 1:
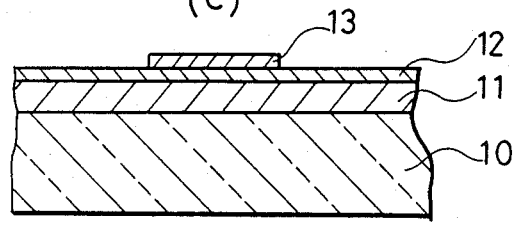
Figure 1:
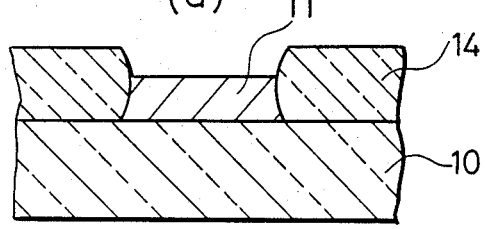
Figure 1:
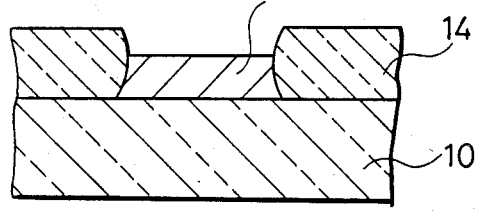
Figure 1:
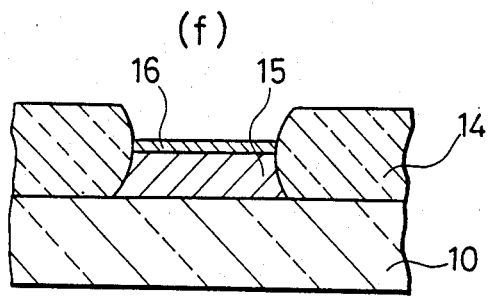
Figure 1:
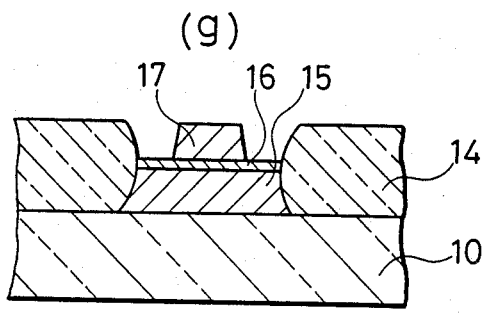
Figure 1:
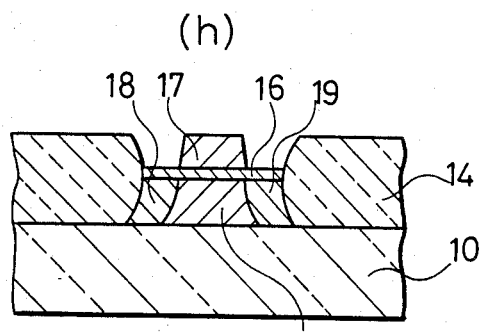
Figure 1:
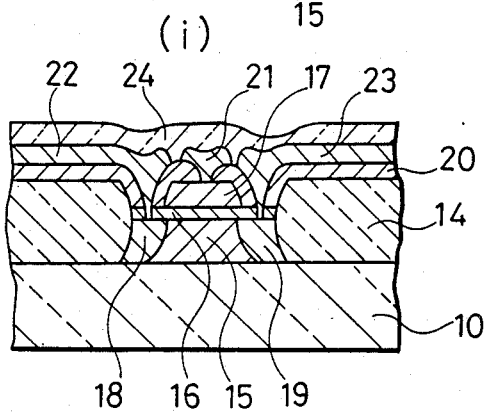
Figure 2:
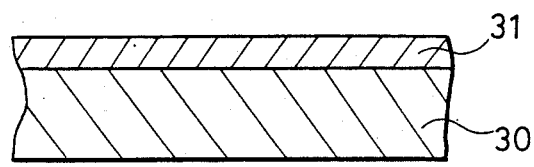
FIGS. 2(a) to (g) are diagrams showing the steps for manufacturing a semiconductor device according to one embodiment of the present invention.
Figure 2:
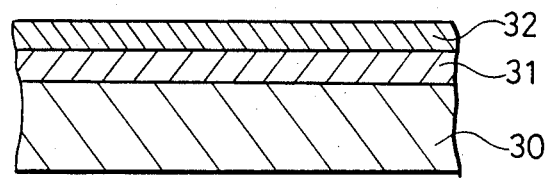
Figure 2:
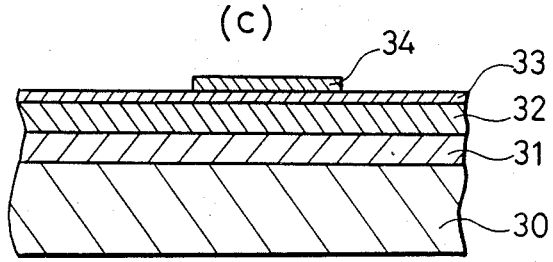
Figure 2:
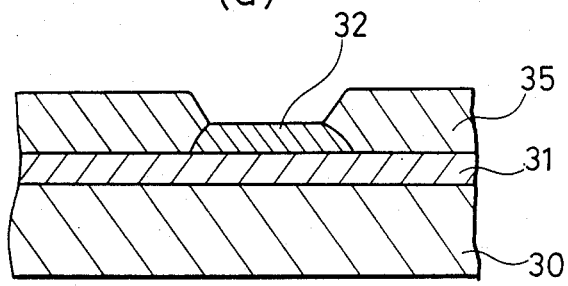
Figure 2:
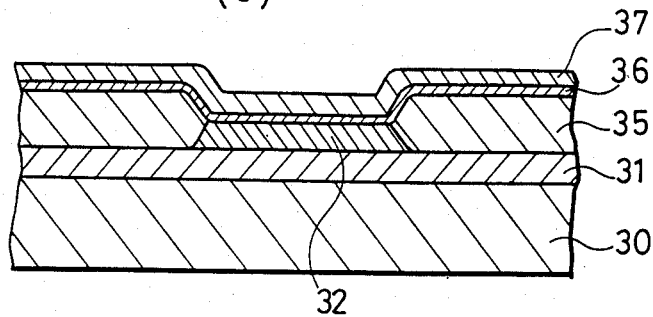
Figure 2:
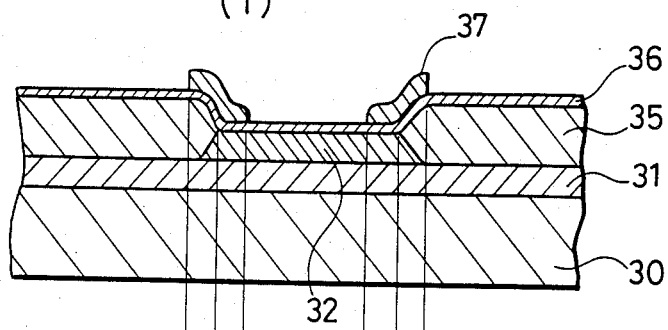
Figure 2:
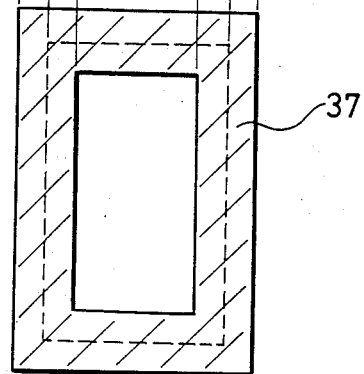

Referring now to FIG. 2, the manufacturing process of a semiconductor device according to one embodiment of the present invention is described below.

At first, as shown in FIG. 2(a), $SiO_2$ layer (heated oxide film) 31 of 1 μm as an insulating layer is produced on a P-type (100) silicon substrate 30 in an oxidizing atmosphere of 950° C. A poly-silicon layer 32 is deposited thereon to a thickness of 5,000 Å by a usual LPCVD method (refer to FIG. 2(b)), and thereafter the product is heated in an oxidizing atmosphere of 950° C. to produce a layer of oxide ($SiO_2$) film 33 of 500 Å. A silicon nitride ($Si_3N_4$) film 34 is deposited thereon by a LPCVD method to a thickness of 1,000 Å, and it is patterned by a predetermined photolithography process (refer to FIG. 2(c)). Then, the material is exposed to an oxidizing atmosphere of 950° C. using the silicon nitride film 34 as an antioxidation mask, and the portions except for the desired island silicon layer 32 are oxidized to form the silicon oxide film 35 as shown in FIG. 2(d). This method is a well-known selective oxidization method. Thereafter, as shown in FIG. 2(e), a thin silicon oxide film 36 and a thin silicon nitride film 37 are successively deposited thereon by respective LPCVD methods. The thin silicon oxide film 36 is provided to stabilize both in configuration and electrically the surface of the poly-silicon layer 32 which should be recrystallized, and the film may have a thickness of 0 to 200 Å, however it is preferrable for the film 36 to have a thickness of 70 to 150 Å to produce a best effect. However, it is not necessary to provide this thin oxide film 36 when the manufacturing process of the semiconductor device includes a process for removing the uppermost surface of the recrystallized silicon layer 32 later.

The thickness of the silicon nitride film 37 must be selected carefully. That is, the thickness of the silicon nitride film 37 must be determined in the thickness range where the film 37 operates as an effective antireflection film against the argon laser of wavelength 4,880 and 5,145 Å as shown in FIG. 3. Hereupon, the distribution of the reflectivity (reflection coefficient) of the silicon nitride film 37 against its thickness is periodical, and it is possible to use the neighbour of 600 Å and 1,800 Å, and the latter thickness is easily controlled so as to form a film of good quality. However, when a thick silicon nitride film of about 1,800 Å is used as an antireflection film, the thermal capacitance thereof increases, increasing the stray of heat by the films conductivity because the silicon nitride film has a larger conductivity than that of the silicon oxide film (it is about 1/5 times of that of silicon). The result is that the straying of heat from the upper portion disturbs the desired thermal distribution regardless of the fact that laser power is introduced to the inside of the silicon layer 32 by the antireflection film. Due to this problem it is desirable that the thickness of the silicon nitride film 37 be selected to be between 400 to 700 Å.

Thereafter, as shown in FIGS. 2(f) and (g), a predetermined region of the silicon nitride film 37 is removed. In this embodiment where the silicon island 32 is of 20 μm width and 80 μm length, there remained peripheral portions of 3 μm width from the boundary of the silicon island 32 towards inside, and also remained under 3 μm portions from the boundary of the silicon island 32 towards outside so as to prevent the decrease of temperature by the thermal conductivity. As a result, a frame shaped region of 6 μm width among the silicon nitride film 37 remained on the silicon island 32.

Figure 4:
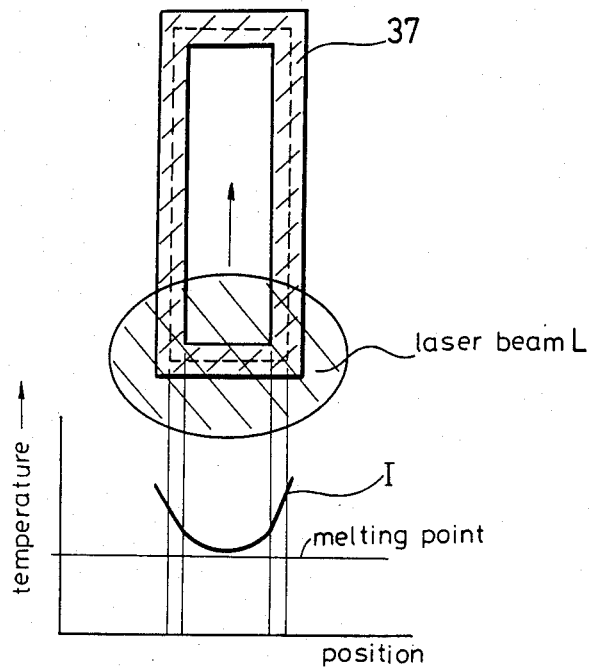
FIGS. 4(a) and (b) are diagrams showing the temperature distributions of the semiconductor device as one embodiment of the present invention when a laser beam is irradiated with scanning thereto.
FIG. 4(c) is a diagram showing the direction of crystal growth in the silicon island after a laser beam is irradiated with scanning thereto.
Figure 4:
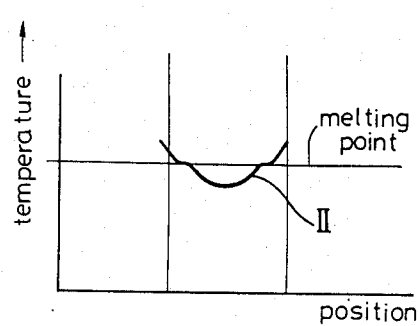
Figure 4:
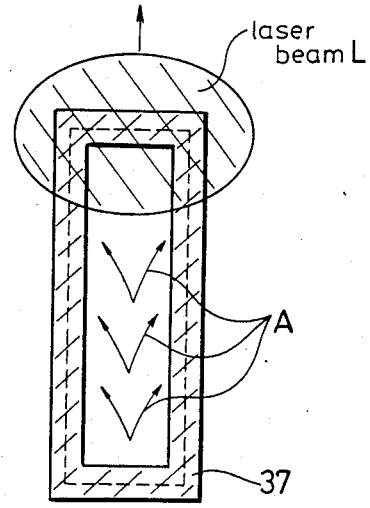

Then, a laser beam L having a spot size of about 40 μm is irradiated with scanning along the length direction of the silicon island 32 to the semiconductor device of the above described construction (refer to FIG. 4(a)). That portion of the poly-silicon region 32, where silicon nitride film 37, exists will absorb approximately twice as much power than the portion of the poly-silicon region 32, without the silicon nitride film 37. absorbed to other region is absorbed to the portion of The result is that the temperature becomes higher in that portion of the poly-silicon layer 32 where the silicon nitride film 37 exists, than the region where the silicon nitride film 37 does not exist. A temperature distribution shown as I in FIG. 4(a) is obtained. Accordingly, when the laser beam L is scanned in the length-wise direction of the silicon island 32 in this state, the central portion of the silicon island 32 is cooled rapidly after the beam passes therethrough, and the recrystallization (refer to the temperature distribution shown as II in FIG. 4(b)) is started from the central portion. Thus, the recrystallized grains having (100) plain which is the most privilege crystal growth direction under this situation increases, and a crystal growth with the grains as its seeds occurs from the center to the periphery as shown by the arrow A in FIG. 4(c). In this way, the whole surface of the silicon island 32 is monocrystallized.

Under the present embodiment, there is provided an antireflection film at a predetermined region of the surface of the silicon island 32 for controlling the temperature distribution while the silicon island 32 is melted and recrystallized, thereby monocrystallizing the entire surface of the silicon island 32 with good reproducibility, and further enabling the production of a semiconductor device on the silicon island 32 with characteristics which are stable and uniform.

In the illustrated embodiment, an island poly-silicon layer is produced by a selective oxidization, but a mesa-type island of poly-silicon layer can be produced by etching the poly-silicon layer with a resist pattern.

According to the present invention, an antireflection film is produced at a predetermined region for each desired island semiconductor layer so as to control the temperature distribution in the melting and recrystallizing of the island semiconductor layer, thereby providing a stable and uniform monocrystalline layer in a semiconductor wafer. This provides a reliable semiconductor device.

The invention being thus described, it will be obvious that the same may be varied in many ways. Such variations are not to be regarded as a departure from the spirit and scope of the invention, and all such modifications as would be obvious to one skilled in the art are intended to be included in the scope of the following claims.

What is claimed is:

1. A method for manufacturing a monocrystalline semiconductor device from a polycrystalline semiconductor layer, comprising the steps of:
   depositing the polycrystalline semiconductor layer on the surface of an insulator substrate;
   producing an island of the polycrystalline semiconductor layer and a layer of dielectric material from the polycrystalline semiconductor layer that surrounds said island of the polycrystalline semiconductor layer;
   covering said island of the polycrystalline semiconductor layer with a film of antireflective material;
   creating a frame of antireflective material enclosing a predetermined region of said island of the polycrystalline semiconductor layer by removing a portion of said film of antireflective material and leaving antireflective material only on said predetermined region of said island; and
   recrystallizing said island of the polycrystalline material by simultaneously irradiating said island and at least a portion of said frame of antireflective material by scanning said island of polycrystalline semiconductor layer and said portion of said frame, with an energy beam, in a direction substantially parallel to said portion of said frame.

2. The method for manufacturing a monocrystalline semiconductor device of claim 1, wherein said frame of antireflective material film includes the boundary of said island of the polycrystalline semiconductor layer.

3. The method for manufacturing a monocrystalline semiconductor device of claim 1, wherein the step of producing said island of polycrystalline semiconductor layer comprises the steps of:
   producing an oxide film on the polycrystalline semiconductor layer;
   producing a film of $Si_3N_4$ on said oxide film;
   patterning the film of $Si_3N_4$ into an island pattern;
   oxidizing the semiconductor layer with the island pattern as an antioxidization mask; and
   removing the island of $Si_3N_4$ film and said oxide film.

4. The method for manufacturing a monocrystalline semiconductor device of claim 1, wherein said step of producing said island of the polycrystalline semiconductor layer comprises producing a mesa-type island of the polycrystalline semiconductor layer by etching portions of the polycrystalline semiconductor layer except for a predetermined region in accordance with a resist pattern.

5. The method for manufacturing a monocrystalline semiconductor device of claim 1, wherein the polycrystalline semiconductor layer comprises silicon.

6. The method of producing a monocrystalline semiconductor device of claim 1 wherein said insulator substrate is created by a process comprising forming an insulating layer on a basic semiconductor.

7. The method for manufacturing a monocrystalline semiconductor device of claim 6, wherein said basic semiconductor comprises silicon.

8. The method of producing a monocrystalline semiconductor device of claim 1 wherein said scanning can be in any direction parallel to at least one portion of said frame.

9. The method of producing a monocrystalline semiconductor device of claim 8 wherein said antireflective material is $Si_3N_4$.

10. The method of producing a monocrystalline semiconductor device of claim 9 further comprising the step of forming a layer of $SiO_2$ on the surface of said island of the polycrystalline semiconductor prior to the step of covering said island with said film of $Si_3N_4$.

11. The method for manufacturing a monocrystalline semiconductor device of claim 10 wherein the thickness of the film of $SiO_2$ is 0 to 200 Å, and wherein the thickness of the film of $Si_3N_4$ is 400 to 700 Å.

* * * * *